United States Patent
Ahn et al.

(10) Patent No.: US 11,523,504 B2
(45) Date of Patent: Dec. 6, 2022

(54) ANODIC OXIDE FILM STRUCTURE

(71) Applicant: POINT ENGINEERING CO., LTD., Asan (KR)

(72) Inventors: Bum Mo Ahn, Suwon (KR); Sung Hyun Byun, Hwaseong (KR); Tae Hwan Song, Cheonan (KR)

(73) Assignee: POINT ENGINEERING CO., LTD., Asan (KR)

( * ) Notice: Subject to any disclaimer, the term of this patent is extended or adjusted under 35 U.S.C. 154(b) by 5 days.

(21) Appl. No.: 17/166,768

(22) Filed: Feb. 3, 2021

(65) Prior Publication Data

US 2021/0251077 A1 Aug. 12, 2021

(30) Foreign Application Priority Data

Feb. 6, 2020 (KR) .......................... 10-2020-0014270

(51) Int. Cl.
| | |
|---|---|
| C23C 28/04 | (2006.01) |
| H05K 1/11 | (2006.01) |
| G01R 1/073 | (2006.01) |
| C23C 28/00 | (2006.01) |

(52) U.S. Cl.
CPC .............. *H05K 1/115* (2013.01); *C23C 28/04* (2013.01); *C23C 28/44* (2013.01); *G01R 1/07342* (2013.01)

(58) Field of Classification Search
None
See application file for complete search history.

(56) References Cited

U.S. PATENT DOCUMENTS

| | | | |
|---|---|---|---|
| 2011/0073827 A1* | 3/2011 | Rubloff | ................. B82Y 10/00 438/129 |
| 2011/0120943 A1* | 5/2011 | Johansson | ......... C23C 16/45525 427/244 |
| 2019/0066571 A1* | 2/2019 | Goward | ............... G09G 3/3233 |

FOREIGN PATENT DOCUMENTS

KR 10-0664900 B1 1/2007

* cited by examiner

*Primary Examiner* — Shamim Ahmed
*Assistant Examiner* — Bradford M Gates

(57) ABSTRACT

Proposed is an anodic oxide film structure that includes an anodic oxide film sheet and has high strength, chemical resistance and corrosion resistance.

6 Claims, 6 Drawing Sheets

T1'>T2'>T3'

T1=T2=T3

ANODIC OXIDE FILM STRUCTURE

CROSS REFERENCE TO RELATED APPLICATION

The present application claims priority based on Korean Patent Application No. 10-2020-0014270, filed on Feb. 6, 2020, the entire content of which is incorporated herein for all purposes by this reference.

BACKGROUND OF THE DISCLOSURE

1. Technical Field

The present disclosure relates to an anodic oxide film structure including an anodic oxide film sheet.

2. Description of the Related Art

An anodic oxide film is capable of being favorably used in a semiconductor or display field that requires a high-temperature processing atmosphere.

An anodic oxide film is manufactured in the form of a thin plate, and may constitute various parts used in the semiconductor or display field.

However, a thin anodic oxide film has a disadvantage in that the strength thereof is weak due to the small thickness thereof.

The anodic oxide film may constitute a wiring board for electrically connecting the probe of a probe card and a printed circuit board (PCB).

The wiring board may include a connection pad that is electrically connected to the probe on at least one surface thereof. Here, one side of the wiring board including the connection pad may be subjected to a MEMS process to form a probe thereon.

The MEMS process may be roughly performed as follows.

First, in order to provide a probe, a masking material layer may be formed on the connection pad, and patterning may be performed so that the upper surface of the connection pad is exposed through a photoresist process. Then, providing a metal material at the patterned position, depositing a seed layer, providing a masking material layer thereon, performing patterning, and filling the patterned position with a metal material may be repeatedly carried out. Then, the probe may be formed on the connection pad by removing the remaining portion other than the metal material using an etching solution.

However, when the wiring board is composed of an anodic oxide film, it is vulnerable to the etching solution used in the MEMS process, which is undesirable.

Briefly, since the anodic oxide film is damaged by the etching solution, it may be relatively vulnerable to the process of forming the probe directly on the connection pad of the wiring board.

As described above, the anodic oxide film may be favorably used in a high-temperature atmosphere, but the anodic oxide film may be problematic because of the relatively weak strength thereof due to the small thickness thereof, easy corrosion in a harsh atmosphere subsequent to exposure to a harsh use environment, and vulnerability to particular kinds of chemical solutions (e.g. alkaline solutions).

CITATION LIST

Patent Literature (Patent Document 0001) Korean Patent No. 10-0664900

SUMMARY OF THE DISCLOSURE

Accordingly, the present disclosure has been made keeping in mind the problems encountered in the related art, and an objective of the present disclosure is to provide an anodic oxide film structure having increased strength and high chemical resistance and corrosion resistance.

An aspect of the present disclosure provides an anodic oxide film structure including an anodic oxide film sheet and a first thin film layer provided on at least one surface of the anodic oxide film sheet, in which the first thin film layer includes a plurality of first monoatomic layers formed by repeatedly performing a cycle of adsorbing a first primary precursor and supplying a first secondary reactant different from the first primary precursor to form a first monoatomic layer through chemical substitution of the first primary precursor and the first secondary reactant.

Also, the thickness of the first thin film layer may fall in the range from 20 nm to 3 μm.

Also, the anodic oxide film sheet may include a non-porous barrier layer in which pores are not formed, and the thickness of the barrier layer may fall in the range from 100 nm to 1 μm.

Also, the anodic oxide film sheet may include a non-porous barrier layer in which pores are not formed, and a porous layer disposed on the barrier layer and having pores formed therein, and a portion of the first thin film layer may be located inside the pores in the porous layer.

Also, a second thin film layer may be formed on the first thin film layer, the second thin film layer including a plurality of second monoatomic layers formed by repeatedly performing a cycle of adsorbing a second primary precursor on the first thin film layer and supplying a second secondary reactant different from the second primary precursor to form a second monoatomic layer through chemical substitution of the second primary precursor and the second secondary reactant, and the first thin film layer and the second thin film layer may have different components.

Also, a through-hole may be provided in the anodic oxide film sheet, and the first thin film layer may be provided on the inner surface of the through-hole.

Also, anodic oxide film sheets may be vertically laminated and bonded to each other by a bonding layer, and a metal material may be provided in the through-hole.

According to the present disclosure, an anodic oxide film structure can exhibit durability, chemical resistance, and abrasion resistance. Moreover, the anodic oxide film structure of the present disclosure is effective at preventing problems of re-exposure of crack portions and outgassing due to corrosion of a thin film layer. Thereby, when the anodic oxide film structure of the present disclosure is provided in a configuration that performs a specific function in a specific field, it is possible to increase the efficiency of the overall performance of the product.

DESCRIPTION OF SPECIFIC EMBODIMENTS

The following description is set forth only to illustrate the principle of the disclosure. Therefore, those skilled in the art may implement the principle of the disclosure and invent various devices which are included within the concept and the scope of the disclosure even if not clearly explained or illustrated in the description. Moreover, in principle, all the conditional terms and embodiments listed in this description are intended for the purpose of understanding the concept of the disclosure clearly, and one should understand that this disclosure is not limited to the exemplary embodiments or conditions.

The above objectives, features, and advantages will be more apparent through the following detailed description in conjunction with the accompanying drawings, so that those of ordinary skill in the art may easily implement the technical spirit of the disclosure.

The embodiments of the present disclosure will be described with reference to cross-sectional views and/or perspective views which schematically illustrate ideal embodiments of the present disclosure. For explicit and convenient description of the technical content, the sizes or thicknesses of films and regions and diameters of holes in the figures may be exaggerated. Therefore, resultant variations from the illustrated shapes due to, for example, manufacturing techniques and/or tolerances are to be expected. Thus, the embodiments of the present disclosure are not to be construed as limited to the particular shapes of regions illustrated herein but are to include deviations in shapes that result from, for example, a manufacturing process.

Hereinafter, a detailed description will be given of preferred embodiments of the present disclosure with reference to the accompanying drawings.

Figure 1A:
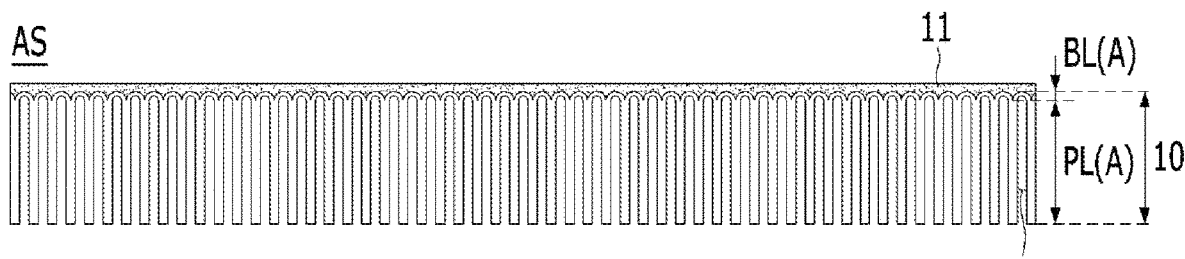
FIGS. 1A to 1D show various embodiments of an anodic oxide film structure according to the present disclosure.
Figure 1B:
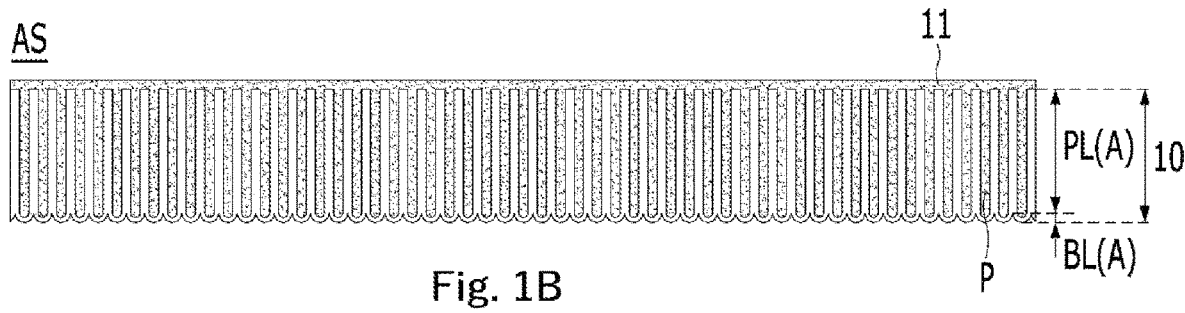
Figure 1C:
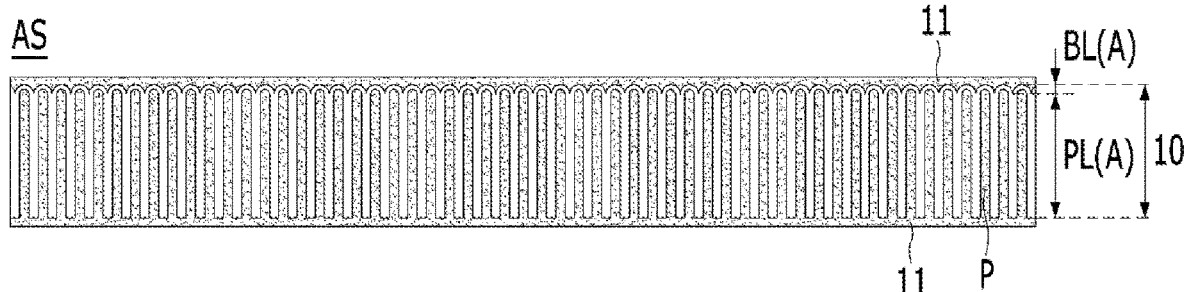
Figure 1D:
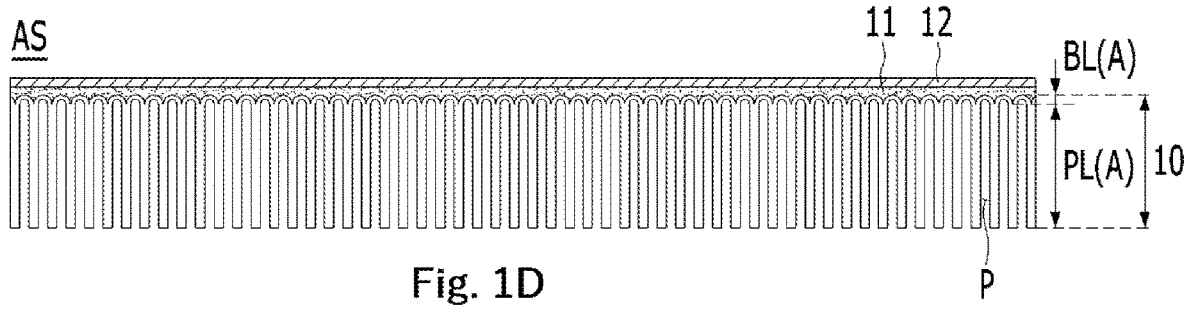
Figure 2A:
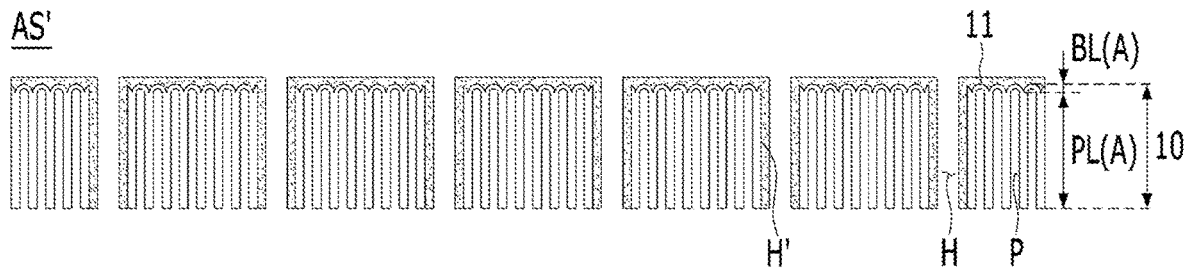
FIGS. 2A to 2D show various modified embodiments of the anodic oxide film structure according to the present disclosure.
Figure 2B:
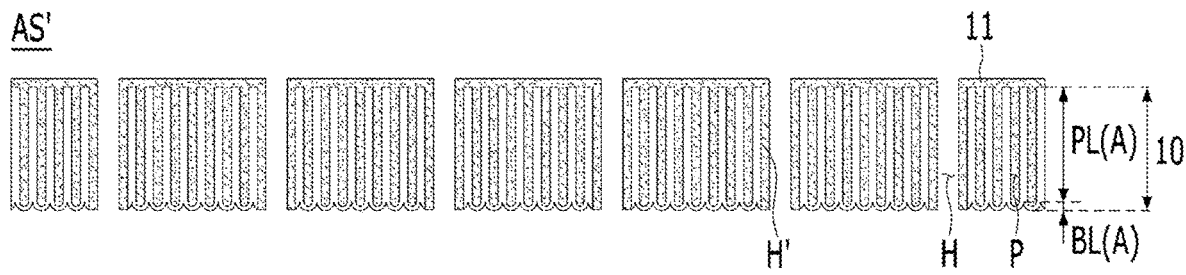
Figure 2C:
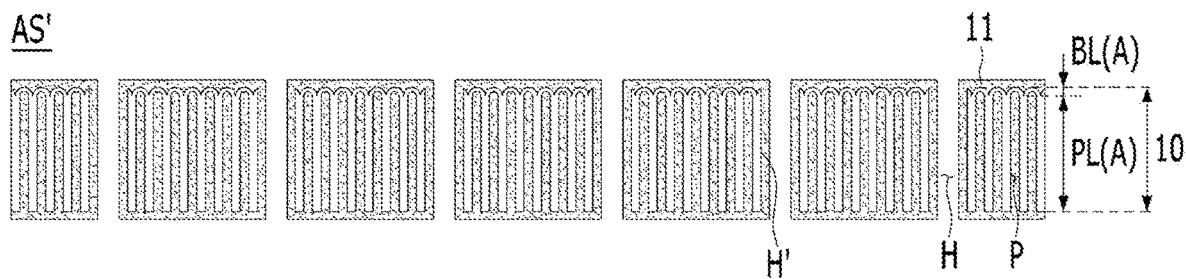
Figure 2D:
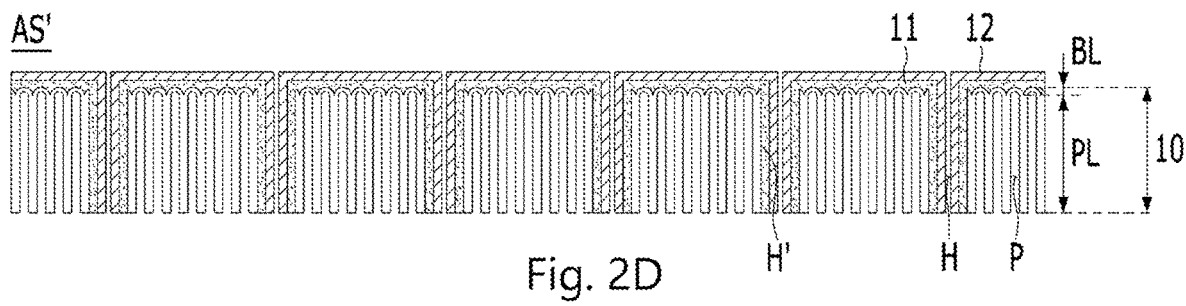
Figure 3:
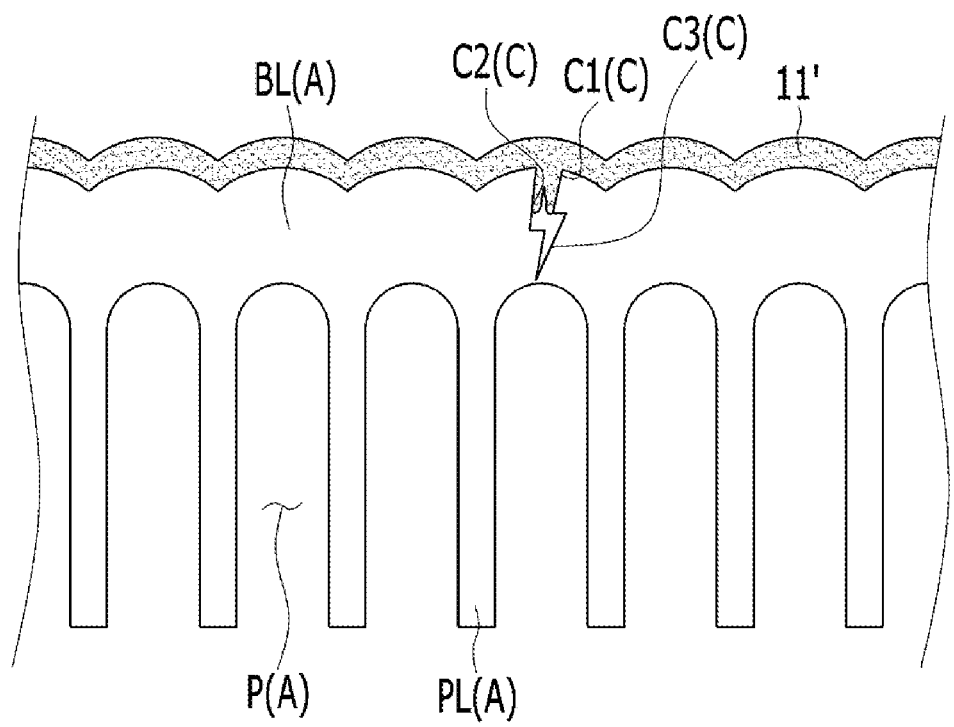
FIG. 3 is an enlarged schematic view showing the state in which a conventional thin film layer is formed on a barrier layer.
Figure 4:
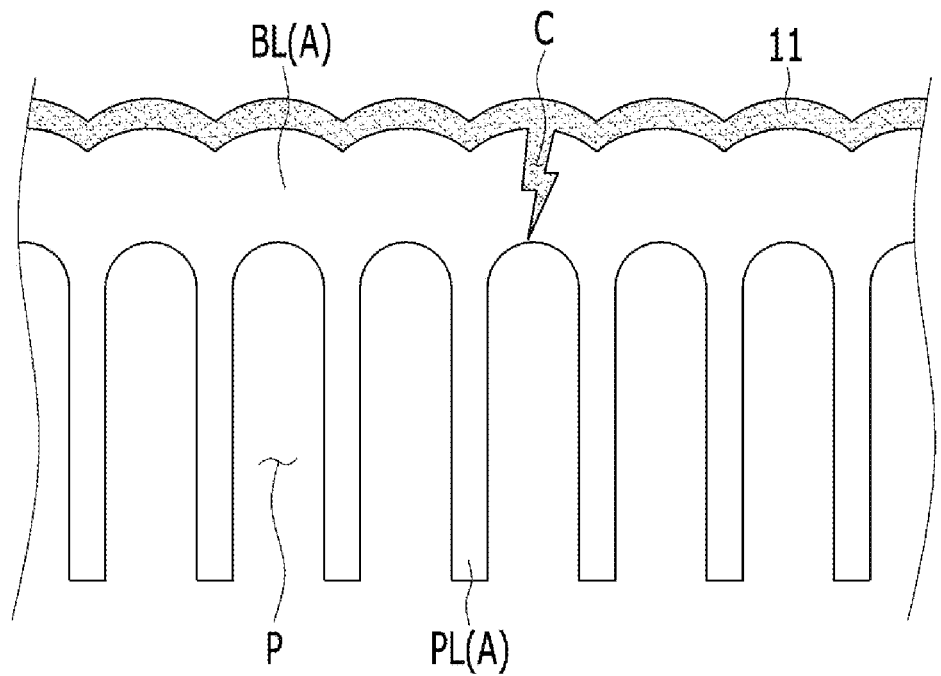
FIG. 4 is an enlarged schematic view showing the state in which a first thin film layer is formed on a barrier layer according to the present disclosure.
Figure 5A:
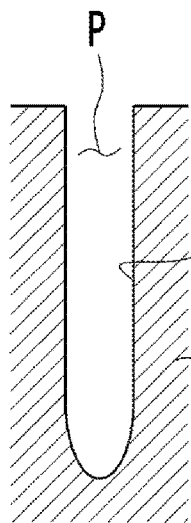
FIGS. 5A to 5C show a process of forming the conventional thin film layer on a porous layer.
Figure 5B:
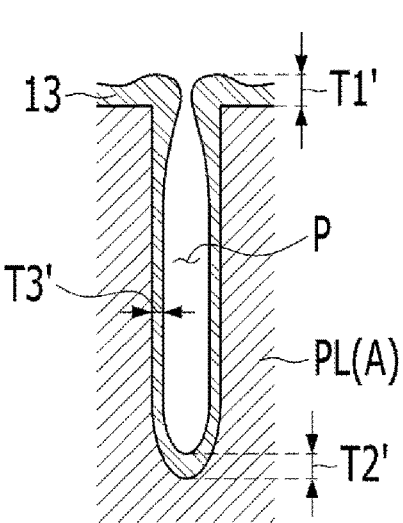
Figure 5C:
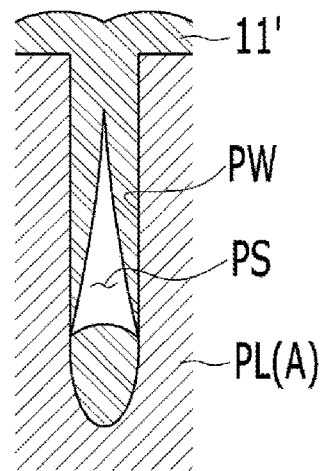
Figure 6A:
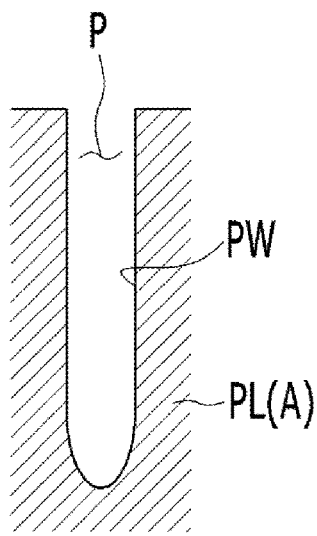
FIGS. 6A to 6C show a process of forming the first thin film layer on a porous layer according to the present disclosure.
Figure 6B:
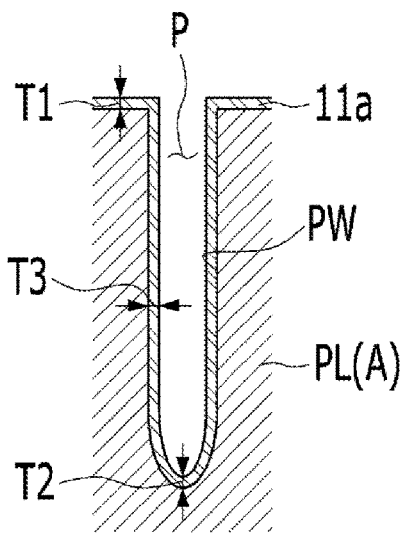
Figure 6C:
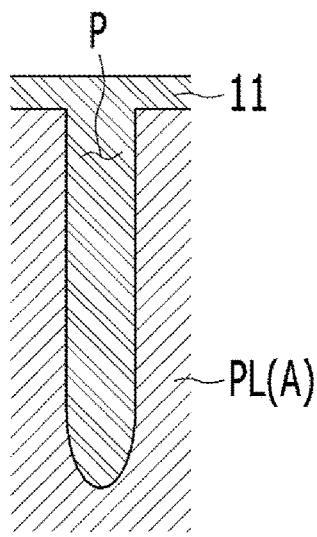

FIGS. 1A to 1D show various embodiments of the anodic oxide film structure AS of the present disclosure, FIGS. 2A to 2D show various modified embodiments of the anodic oxide film structure AS of the present disclosure, FIG. 3 is an enlarged schematic view showing the state in which a conventional thin film layer 11' is formed on a barrier layer BL, FIG. 4 is an enlarged schematic view showing the state in which a first thin film layer is formed on a barrier layer BL according to the present disclosure, FIGS. 5A to 5C show a process of forming the conventional thin film layer 11' on a porous layer PL, and FIGS. 6A to 6C show a process of forming the first thin film layer 11 on a porous layer PL according to the present disclosure.

As shown in FIGS. 1A to 1D, the anodic oxide film structure AS of the present disclosure may be configured to include an anodic oxide film sheet 10 and a first thin film layer 11 provided on at least one surface of the anodic oxide film sheet 10.

The anodic oxide film sheet 10 may be manufactured through the following process.

First, anodizing may be performed on an aluminum substrate. Thereby, an anodic oxide film A made of aluminum oxide ($Al_2O_3$) is formed on the surface of the substrate. The anodic oxide film A includes a barrier layer BL, in which pores P are not formed, and a porous layer PL, in which pores P are formed.

The barrier layer BL is located on the substrate, and the porous layer PL is located on the barrier layer BL. Specifically, when anodizing is performed on the substrate, the barrier layer BL is first formed, and the porous layer PL is formed after the thickness of the barrier layer BL reaches a predetermined level.

The thickness of the barrier layer BL falls in the range from tens of nm to ones of μm, and preferably 100 nm to 1 μm.

The thickness of the porous layer PL falls in the range from tens of nm to hundreds of μm.

The diameter of the pores P included in the porous layer PL falls in the range from ones of nm to hundreds of nm.

Subsequently, removing the substrate from the surface of the anodic oxide film A having the barrier layer BL and the porous layer PL may be performed. Thereby, an anodic oxide film (A) made of aluminum oxide ($Al_2O_3$) remains.

The anodic oxide film sheet 10 may be configured such that the barrier layer BL is located under the porous layer PL, or may be configured such that the barrier layer BL is located on the porous layer PL.

The anodic oxide film sheet 10 may be configured such that the porous layer PL is located on or under the barrier layer BL, so the upper and lower surfaces thereof are asymmetrical.

There may be a difference in density between the porous layer PL and the barrier layer BL due to the presence or absence of the pores P. The barrier layer BL is a region that does not include the pores P, and may have higher density than the porous layer PL.

The anodic oxide film sheet 10 may be configured such that the barrier layer BL is located on the porous layer PL or under the porous layer PL, and the first thin film layer 11 may be provided on at least one surface thereof. Accordingly, the anodic oxide film structure AS of the present disclosure may be implemented in various embodiments, as shown in FIGS. 1A to 1D.

As shown in FIG. 1A, the anodic oxide film sheet 10 may be configured such that the barrier layer BL is located on the porous layer PL.

The anodic oxide film sheet 10 may include a first thin film layer 11 on at least one surface thereof.

As shown in FIG. 1A, in an exemplary embodiment, the anodic oxide film sheet 10 may include a first thin film layer 11 on the upper surface thereof. The anodic oxide film sheet 10 shown in FIG. 1A may be configured such that the barrier layer BL is located on the porous layer PL, so the first thin film layer 11 may be formed on the upper surface of the barrier layer BL.

The first thin film layer 11 may be formed by repeatedly performing a cycle of adsorbing a first primary precursor on at least one surface of the anodic oxide film sheet 10 and supplying a first secondary reactant different from the first primary precursor to form a first monoatomic layer 11a through chemical substitution of the first primary precursor and the first secondary reactant.

Specifically, the first thin film layer 11 may be formed as follows.

First, a first primary precursor may be supplied and adsorbed on at least one surface of the anodic oxide film sheet 10, thus forming a first primary precursor adsorption layer. Here, the first primary precursor adsorption layer may be formed as a single layer through a self-limiting reaction.

Then, an inert gas may be supplied thereto.

In the step of supplying the inert gas, an excess of the first primary precursor remaining in the first primary precursor adsorption layer may be removed. As described above, the first primary precursor is formed as a single layer through a self-limiting reaction. Accordingly, the first primary precursor remaining in the first primary precursor adsorption layer is to be removed.

In the step of supplying the inert gas, supplying an inert gas to the anodic oxide film sheet 10 including the first primary precursor may be performed, whereby the excess first primary precursor may be removed.

Then, the first secondary reactant may be adsorbed and substituted.

In the step of adsorbing and substituting the first secondary reactant, the first secondary reactant may be supplied to the surface of the first primary precursor adsorption layer. Accordingly, the first secondary reactant may be adsorbed on the surface of the first primary precursor adsorption layer. The first primary precursor adsorption layer and the first secondary reactant may be chemically substituted. Thereby, the first monoatomic layer 11a may be formed.

The first primary precursor and the first secondary reactant have different components.

Since the first monoatomic layer 11a is formed through chemical substitution of the first primary precursor and the first secondary reactant, the component of the first monoatomic layer 11a may be different from the component of the first primary precursor and the component of the first secondary reactant.

The remaining components of the first primary precursor and the first secondary reactant during the formation of the first monoatomic layer 11a may be discharged as gas.

The first thin film layer 11 may be composed of a plurality of first monoatomic layers 11a by repeating the cycle described above. The anodic oxide film structure AS may be provided with the first thin film layer 11 by repeating the formation of the first monoatomic layer 11a on at least one surface thereof.

The thickness of the first thin film layer 11 may fall in the range from ones of nm to ones of μm, and preferably 20 nm to 3 μm. Accordingly, forming the first monoatomic layer 11a is preferably repeated such that the first thin film layer 11 is formed to a thickness of 20 nm to 3 μm.

The plurality of first monoatomic layers 11a has crystalline properties.

The first thin film layer 11 may be formed of at least one selected from among aluminum oxide ($Al_2O_3$), yttrium oxide ($Y_2O_3$), aluminum nitride (AlN), silicon dioxide ($SiO_2$), silicon nitride ($Si_3N_4$), and silicon carbide (SiC).

The first thin film layer 11 may be formed of at least one selected from among the above-described materials and may thus have chemical resistance to specific chemicals used in a specific process (e.g. an etching process).

Also, the first thin film layer 11 may include a plurality of first monoatomic layers 11a having crystalline properties, and thus may exhibit high rigidity and strength.

According to the present disclosure, the first thin film layer 11 is provided on at least one surface of the anodic oxide film sheet 10, whereby damage thereto due to chemicals may be prevented even when used in a specific field and exposed to specific chemicals. Moreover, according to the present disclosure, the low strength of the anodic oxide film sheet 10 owing to the thinness thereof may be increased by virtue of the first thin film layer 11.

As shown in FIGS. 3 and 4, since the anodic oxide film sheet 10 is manufactured in the form of a thin plate, a portion thereof may be damaged in the manufacturing process and a crack C may form in the barrier layer BL.

FIG. 3 is an enlarged schematic view showing the state in which a thin film layer 11' (hereinafter referred to as a "conventional thin film layer") is conventionally formed on the anodic oxide film sheet 10 having a crack C using a chemical vapor deposition processing device or a physical vapor deposition processing device.

As shown in FIG. 3, the anodic oxide film sheet 10 may have a fine gap formed in the barrier layer BL due to a crack C. The barrier layer BL of the anodic oxide film sheet 10 may be conventionally subjected to a deposition process using a chemical vapor deposition processing device or a physical vapor deposition processing device.

The crack C is formed with a fine gap, and may have an irregular shape. Thus, the conventional deposition layer may be formed to be relatively thick on the upper portion C1 of the crack C having a wide gap, but may be formed to be thin on the inner surface C2 of the crack C and the lower portion of the crack C, or may not be formed at all.

Therefore, the conventional deposition layer is formed to be the thickest on the upper surface of the barrier layer BL and on the upper portion C1 of the crack C to thus form a thin film layer 11' in a form that covers the upper portion C1 of the crack C.

Specifically, the conventional thin film layer may be provided as a thin film layer 11' in a form that mainly covers only the upper surface of the barrier layer BL and a portion of the exposed surface of the crack C (particularly the upper portion C1). Accordingly, even when the anodic oxide film sheet 10 includes the thin film layer 11', a gap may be present in the inner surface C2 and the lower portion C3 of the crack C.

When the anodic oxide film structure including the conventional thin film layer 11' is used for a long period of time, the thin film layer 11' may be removed or may corrode through a chemical reaction with a processing gas. Thereby, in the anodic oxide film structure including the thin film layer 11', the gap present in the inner surface C2 and the lower portion C3 of the crack C may become exposed, and thus, the anodic oxide film structure including the conventional thin film layer 11' may be damaged in the region of the exposed crack C.

However, according to the present disclosure, the first thin film layer 11 may be formed by depositing a plurality of first monoatomic layers 11a to a predetermined thickness. One first monoatomic layer 11a may be formed on the upper surface of the barrier layer BL through chemical substitution of the first primary precursor and the first secondary reactant. Accordingly, the plurality of first monoatomic layers 11a may be obtained by repeatedly performing a cycle for forming one first monoatomic layer 11a.

FIG. 4 is an enlarged schematic view showing the state in which the first thin film layer 11 of the present disclosure is formed on the barrier layer BL of the anodic oxide film sheet 10 having therein a crack C.

As shown in FIG. 4, the first thin film layer 11 of the present disclosure may be provided by forming the first monoatomic layer 11a to the same thickness.

The anodic oxide film sheet 10 may include a first thin film layer 11 composed of a plurality of first monoatomic layers 11*a* by performing a plurality of cycles of forming the first monoatomic layer 11*a* on the upper surface of the barrier layer BL. Thereby, even when an irregularly shaped crack C is formed in the anodic oxide film sheet 10, the crack C may be completely filled by the first thin film layer 11.

Briefly, the first thin film layer 11 may perform a function of repairing a fine gap in the anodic oxide film sheet 10 while filling the crack C to a predetermined thickness. The barrier layer BL may have a structure in which the crack C is repaired and eliminated by the first thin film layer 11.

In the anodic oxide film structure AS of the present disclosure, a fine gap due to the crack C may be prevented from forming by virtue of the first thin film layer 11. Thus, in the present disclosure, even when the first thin film layer 11 is removed or corrodes due to long-term use, a problem of subsequent damage owing to exposure of the crack C may be fundamentally prevented.

Therefore, the anodic oxide film structure AS of the present disclosure is capable of ensuring high rigidity and strength through the first thin film layer 11 while maintaining the thinness of the anodic oxide film sheet 10.

Moreover, according to the present disclosure, even when a fine crack C is present due to the small thickness of the anodic oxide film sheet 10, the crack C may be eliminated by the first thin film layer 11, thereby increasing durability.

As shown in FIG. 1B, the anodic oxide film sheet 10 may be configured such that a porous layer PL having pores P formed therein is located on a non-porous barrier layer BL. Thus, the surface of the anodic oxide film sheet 10 may be composed of the porous layer PL.

In an exemplary embodiment, the anodic oxide film structure AS may include a first thin film layer 11 on the upper surface of the anodic oxide film sheet 10 composed of the porous layer PL.

The first thin film layer 11 may be provided in the same configuration and process as the configuration described above with reference to FIG. 1A.

As shown in FIG. 1B, the anodic oxide film structure AS may be configured such that the first thin film layer 11 is provided on the upper surface of the porous layer PL, and thus a portion of the first thin film layer 11 is located in the pores P.

The inside of the pores P may be filled such that there is no space while the plurality of first monoatomic layers 11*a* is sequentially formed. The first monoatomic layers 11*a* may be formed to a predetermined thickness on the upper surface of the porous layer PL. The first monoatomic layers 11*a* may be formed to a predetermined thickness even inside the pores P. Thereby, the inside of the pores P may be filled with the first monoatomic layers 11*a* such that there is no empty space therein.

The process of forming the first thin film layer 11 on the porous layer PL of the present disclosure is described in detail with reference to FIGS. 5A to 5C and 6A to 6C.

FIGS. 5A to 5C show the process of forming the conventional thin film layer 11' on the porous layer PL.

As shown in FIG. 5A, a deposition process is conventionally performed on the porous layer PL using a chemical vapor deposition processing device or a physical vapor deposition processing device. Thereby, as shown in FIG. 5B, a deposition layer 13 is formed on the porous layer PL.

Here, the deposition layer 13 satisfies the relationship $T1'>T2'>T3'$ between an upper thickness $T1'$ formed on the upper surface of the porous layer PL, a thickness $T2'$ formed on the bottom surface of the pore P, and a thickness $T3'$ formed on the inner wall PW of the pore P.

As shown in FIG. 5C, the thin film layer 11' is conventionally formed by increasing the thickness of the deposition layer 13.

Specifically, the thicknesses $T1'$, $T2'$, $T3'$ of the deposition layer 13 are increased differently for each formation location. As shown in FIG. 5C, the deposition layer 13 may be increased in a manner in which the thickness $T1'$ on the upper surface of the porous layer PL, the thickness $T3'$ on the inner wall PW of the pore P, and the thickness $T2'$ on the bottom surface of the pore P are different from each other.

The upper surface of the porous layer PL is a region formed around the opening of the pore P, and may be formed to be relatively flat. Accordingly, the deposition layer 13 may be relatively easily deposited on the upper surface of the porous layer PL, so the thickness $T1'$ thereof may be large.

Meanwhile, since the inner wall PW of the pore P is formed with a vertical surface formed depending on the depth thereof, the thickness $T3'$ of the deposition layer 13 may be relatively small.

The deposition layer 13 may be more easily formed on the bottom surface of the pore P than on the inner wall PW of the pore P, but the deposition layer 13 may be formed to a small thickness $T2'$ compared to the upper surface of the porous layer PL.

Accordingly, the deposition layer 13 may be formed to be the thickest on the upper surface of the porous layer PL and around the opening of the pore P to thus result in a thin film layer 11' in a form that covers the opening of the pore P.

However, since the deposition layer 13 is formed to a relatively small thickness $T3'$ on the inner wall PW of the pore P, it may be difficult to completely fill the inside of the pore P. Hence, the pore P has a space PS because the thin film layer 11' is not formed therein.

When the conventional thin film layer 11' is used for a long period of time, the thin film layer 11' formed at the upper surface may be removed or may corrode through a chemical reaction with a processing gas. Thereby, the inner space PS of the pore P is exposed to the outside. Thus, foreign matter is introduced into and remains in the inner space PS of the pore P, which may cause poor performance.

Moreover, when the surface of the anodic oxide film sheet 10, which is composed of the porous layer PL, is provided with the conventional thin film layer 11', a problem of outgassing may occur. Specifically, the thin film layer 11' may be removed from the surface of the anodic oxide film sheet 10 or may corrode upon long-term use. Thereby, the inner space PS of the pore P may be exposed. Here, external particles may be introduced into the inner space PS of the pore P. The particles may be dropped onto the surface of a wafer W or a substrate during semiconductor or display processing, and thus may have a negative effect thereon. This phenomenon is known as outgassing of particles. When the anodic oxide film sheet includes the conventional thin film layer 11' on the surface of the porous layer PL, this outgassing phenomenon may easily occur.

However, in the present disclosure, the plurality of first monoatomic layers 11*a* is provided to a predetermined thickness to form the first thin film layer 11, so problems of particle introduction and outgassing may be more effectively prevented.

FIGS. 6A to 6C show the process of forming the first thin film layer 11 on the porous layer PL according to the present disclosure.

As shown in FIG. 6A, the pore P may be in a state in which the inside thereof is exposed. In the present disclosure, as shown in FIG. 6B, one first monoatomic layer 11a may be formed on the upper surface of the porous layer PL through chemical substitution of the first primary precursor and the first secondary reactant.

As such, the first monoatomic layer 11a may satisfy the relationship T1=T2=T3 between the thickness T1 on the upper surface of the porous layer PL, the thickness T2 on the bottom surface of the pore P, and the thickness T3 on the inner wall PW of the pore P. Briefly, the first monoatomic layer 11a may be formed to the same thickness on the porous layer PL.

The first thin film layer 11 may be formed on the porous layer PL by repeatedly performing a cycle for forming a first monoatomic layer 11a. As shown in FIG. 6C, the first monoatomic layers 11a may be formed to a predetermined thickness to result in the first thin film layer 11. Thus, the pore P may not have an empty space therein while the inside of the pore P is completely filled with the first thin film layer 11.

With this structure, the anodic oxide film structure AS is capable of ensuring rigidity even when the porous layer PL, having relatively low density, constitutes the surface thereof.

As described above, even when the anodic oxide film structure AS of the present disclosure is used for a long period of time and thus the first thin film layer 11 corrodes, there is no empty space inside the pore P. The inside of the pore P may be filled by the first thin film layer 11 so that no empty space remains therein. Accordingly, when the anodic oxide film structure AS includes the first thin film layer 11 on the upper surface of the porous layer PL, the internal rigidity may be maintained despite corrosion of the first thin film layer 11 on the upper surface thereof.

In the present disclosure, the first thin film layer 11 may be formed on the porous layer PL constituting at least one surface of the anodic oxide film sheet 10, particularly the upper surface thereof. Thereby, the anodic oxide film structure AS may be formed in a structure in which the upper surface thereof is covered, so the problem of introduction of particles to the inside thereof may be prevented.

Also, the anodic oxide film structure AS may have a structure in which the inside of the pore P is completely filled with the first thin film layer 11. Thus, the anodic oxide film structure AS may be formed in a structure in which there is no empty space therein due to the first thin film layer 11. Thereby, even when the first thin film layer 11 is partially removed or corrodes due to long-term use of the anodic oxide film structure AS, a problem in which particles are introduced into the pore P may be prevented.

Moreover, since the anodic oxide film structure AS does not have an empty space therein due to the first thin film layer 11, the problem of particles therein may be fundamentally prevented. Ultimately, the anodic oxide film structure AS of the present disclosure may not cause the problem of outgassing of particles occurring inside.

FIG. 1C shows a structure in which the first thin film layer 11 is provided on each of the upper and lower surfaces of the anodic oxide film sheet 10. As shown in FIG. 1C, the anodic oxide film structure AS may include the anodic oxide film sheet 10 such that the barrier layer BL is located on the porous layer PL.

In the anodic oxide film structure AS, forming the first thin film layer 11 on the upper surface composed of the barrier layer BL may be conducted, and forming the first thin film layer 11 on the lower surface may be conducted.

Accordingly, the anodic oxide film structure AS of the present disclosure may be configured such that the first thin film layer 11 is provided on each of the upper and lower surfaces of the anodic oxide film sheet 10.

With this structure, the anodic oxide film structure AS is capable of increasing the density of the lower surface, which is relatively low in density due to the porous layer PL.

The barrier layer BL has relatively high density, and higher rigidity may be exhibited by providing the first thin film layer 11 on the upper surface thereof. Also, the porous layer PL may be increased in density due to the first thin film layer 11, and thus the strength thereof may be increased.

Thereby, the densities of the upper and lower surfaces of the anodic oxide film structure AS may become uniform to some extent, and the durability and strength of the structure itself may be further increased.

FIG. 1D illustrates a structure that further includes a second thin film layer 12 on the first thin film layer 11. Here, the anodic oxide film sheet 10 may be configured such that the barrier layer BL is located on the porous layer PL. The structure of the anodic oxide film sheet 10 is not limited thereto, and may be configured such that the porous layer PL is located on the barrier layer BL.

The upper surface of the anodic oxide film sheet 10 may be composed of the barrier layer BL, and the first thin film layer 11 may be provided on the upper surface of the barrier layer BL. The second thin film layer 12 may be provided on the first thin film layer 11.

The second thin film layer 12 may include a plurality of second monoatomic layers, formed by repeatedly performing a cycle of adsorbing a second primary precursor on the first thin film layer 11 and supplying a second secondary reactant, different from the second primary precursor, to form a second monoatomic layer through chemical substitution of the second primary precursor and the second secondary reactant.

The second thin film layer 12 may be provided by repeatedly performing the cycle of forming the second monoatomic layer after forming the first thin film layer 11 on the upper surface of the barrier layer BL.

Specifically, the second primary precursor may be supplied on the first thin film layer 11. Thereby, the second primary precursor may be adsorbed on the surface of the first thin film layer 11 to form a second primary precursor adsorption layer on the surface of the first thin film layer 11. The second primary precursor adsorption layer may be formed as a single layer through a self-limiting reaction.

After formation of the second primary precursor adsorption layer on the surface of the anodic oxide film sheet 10 including the first thin film layer 11, an inert gas may be supplied thereto.

The inert gas may function to remove an excess of the second primary precursor remaining in the second primary precursor adsorption layer. Since the second primary precursor adsorption layer is formed as a single layer through a self-limiting reaction, the remaining excess second primary precursor is removed by the inert gas.

Then, a second secondary reactant may be supplied to the surface of the second primary precursor adsorption layer of the anodic oxide film sheet 10. The second secondary reactant may be adsorbed on the surface of the second primary precursor, and the second primary precursor adsorption layer and the second secondary reactant may be chemically substituted. Thereby, a second monoatomic layer may be formed.

The second secondary reactant and the second primary precursor have different components.

The second monoatomic layer may be formed through chemical substitution of the second primary precursor adsorption layer, made of the second primary precursor, and the second secondary reactant. Accordingly, the component of the second monoatomic layer may be different from the component of the second primary precursor and the component of the second secondary reactant.

The remaining components of the second primary precursor and the second secondary reactant during the formation of the second monoatomic layer may be discharged as gas.

The second thin film layer 12 may be formed to a thickness ranging from ones of nm to ones of μm, and preferably 20 nm to 3 μm. Accordingly, the second thin film layer 12 may be configured such that the plurality of second monoatomic layers is formed to a thickness ranging from 20 nm to 3 μm.

The component of the second thin film layer 12 may be different from that of the first thin film layer 11.

For example, when the component of the second monoatomic layer constituting the second thin film layer 12 is aluminum oxide ($Al_2O_3$), the component of the first monoatomic layer 11a constituting the first thin film layer 11 may be silicon dioxide ($SiO_2$).

As described above, in the present disclosure, the first thin film layer 11 and the second thin film layer 12 may be formed of different components. Accordingly, the first primary precursor and the second primary precursor may have different components. Alternatively, the first secondary reactant and the second secondary reactant may have different components.

For example, even when the component of the first primary precursor is the same as the component of the second primary precursor, the first primary reactant and the second secondary reactant may have different components. Accordingly, the component of the first thin film layer 11 and the component of the second thin film layer 12 may be different from each other.

Briefly, according to the present disclosure, at least one among the pair of the first primary precursor and the second primary precursor and the pair of the first secondary reactant and the second secondary reactant may be configured to have different components such that the first thin film layer 11 and the second thin film layer 12 have different components.

In the present disclosure, since the first and second thin film layers 11, 12 have different components, various properties may be exhibited.

For example, the first thin film layer 11 may be formed of a component having heat resistance, and the second thin film layer 12 may be formed of a component having corrosion resistance. In this case, the anodic oxide film structure AS may exhibit both high heat resistance and high corrosion resistance.

In addition, the first thin film layer 11 may be formed of a component having voltage resistance, and the second thin film layer 12 may be formed of a component having plasma resistance. In this case, the anodic oxide film structure AS may exhibit both high voltage resistance and high plasma resistance.

The anodic oxide film structure AS of the present disclosure may further include a plurality of thin film layers composed of monoatomic layers on the second thin film layer 12.

The plurality of thin film layers may be formed in the same manner as the formation of the first and second thin film layers 11, 12 described above, and may have the same configuration. In the anodic oxide film structure AS including the plurality of thin film layers, there is no limitation as to the number of thin film layers. As such, the plurality of thin film layers preferably has components different from the first and second thin film layers 11, 12. Thereby, different properties may be exhibited in the present disclosure.

Since the anodic oxide film structure AS includes a plurality of thin film layers (e.g. first and second thin film layers 11, 12), it is possible to ensure further improved rigidity in view of surface strength, as well as various properties.

In an exemplary embodiment, when the anodic oxide film structure AS of the present disclosure is provided as a constituent of a specific apparatus, the surface of the constituent may be composed of the plurality of thin film layers 11, 12.

In a more specific embodiment, a plurality of anodic oxide film structures AS may be provided to form a multilayer wiring board of a probe card 20. Here, the anodic oxide film structure AS may be configured such that first and second thin film layers 11, 12 are provided on the upper surface of the barrier layer BL. The first and second thin film layers 11, 12 may be sequentially formed on the upper surface of the barrier layer BL.

The anodic oxide film structure AS may be provided so that the upper and lower surfaces of the multilayer wiring board are composed of the first and second thin film layers 11, 12.

The anodic oxide film structure AS of the present disclosure makes the surface density of the multilayer wiring board uniform through the first and second thin film layers 11, 12 when forming the multilayer wiring board. Thereby, the resulting multilayer wiring board may not be warped, and the durability of the product itself may be improved.

In an embodiment of the present disclosure, each of the first and second thin film layers 11, 12 may include a plurality of monoatomic layers (specifically, the first monoatomic layers 11a for the first thin film layer 11 and the second monoatomic layers for the second thin film layer 12).

On the other hand, each of the first and second thin film layers 11, 12 may include a single monoatomic layer, rather than the plurality of monoatomic layers.

Specifically, the first thin film layer 11 may include only one first monoatomic layer 11a, and the second thin film layer 12 may include only one second monoatomic layer.

On the other hand, any one of the first and second thin film layers 11, 12 may include a single monoatomic layer, and the remaining one thereof may include a plurality of monoatomic layers.

Specifically, the first thin film layer 11 may include a single monoatomic layer, and the second thin film layer 12 may include a plurality of monoatomic layers. Alternatively, the first thin film layer 11 may include a plurality of monoatomic layers, and the second thin film layer 12 may include a single monoatomic layer.

The anodic oxide film structure AS may be configured such that the first thin film layer 11 and/or the second thin film layer 12 selectively include a single monoatomic layer or a plurality of monoatomic layers. Thereby, the thickness of each of the first thin film layer 11 and the second thin film layer 12 may be easily set to a desired level.

The anodic oxide film structure AS of the present disclosure may have high rigidity by forming the first thin film layer 11 on at least one surface thereof. Even when the first thin film layer 11 is formed on the surface of either of the porous layer PL and the barrier layer BL of the anodic oxide film sheet 10, the thickness thereof may be set to a specific range (preferably from 20 nm to 2 μm), thereby improving the surface strength of the structure.

Since the first thin film layer 11 is formed to a predetermined thickness, it may perform a function of completely filling an empty space depending on the location thereof. For example, when the first thin film layer 11 is provided on the upper surface of the porous layer PL in a configuration in which the porous layer PL constitutes the upper surface of the anodic oxide film sheet 10, a portion thereof may be located inside the pores P in the porous layer PL. Accordingly, the pores P may be filled with the first thin film layer 11. Thereby, the rigidity of the anodic oxide film structure AS may be increased because there is no empty space therein.

On the other hand, the crack C in the barrier layer BL may be filled with the first thin film layer 11. Accordingly, even when the anodic oxide film structure AS includes an anodic oxide film sheet 10 in which a fine crack C is present, the crack C may be repaired and eliminated by the first thin film layer 11. Thereby, even when the anodic oxide film structure AS is used for a long period of time, a problem of exposure of the crack C does not occur, and thus further improved durability may be obtained.

Therefore, the anodic oxide film structure AS of the present disclosure is capable of exhibiting both high strength and high durability by providing the first thin film layer 11 on at least one surface of the anodic oxide film sheet 10.

FIGS. 2A to 2D show various modified embodiments of the anodic oxide film structure AS of the present disclosure. The anodic oxide film structure AS according to a modified embodiment differs from the anodic oxide film structure AS according to an embodiment in that through-holes H are provided in the anodic oxide film sheet 10.

In modified embodiments shown in FIGS. 2A to 2C, each through-hole H may be provided in the anodic oxide film sheet 10, and the first thin film layer 11 may be formed on the inner surface H' of the through-hole H.

As shown in FIG. 2A, a modified embodiment may provide an anodic oxide film sheet 10 having therein through-holes H such that the barrier layer BL is located on the porous layer PL. Then, the first thin film layer 11 may be provided on the barrier layer BL.

Here, the first thin film layer 11 may also be formed on the inner surface H' of each through-hole H. As described above, the first thin film layer 11 may include a plurality of first monoatomic layers 11a formed to a predetermined thickness through chemical substitution of the first primary precursor and the first secondary reactant.

Thus, the first thin film layer 11 may be provided in a form of coating the inner surface H' of the through-hole H to a predetermined thickness.

Thereby, the modified embodiment is capable of exhibiting abrasion resistance and/or corrosion resistance for a specific configuration therein.

For example, the anodic oxide film structure AS' may be configured such that a probe 60 is provided in a through-hole H in a probe card (vertical type). The through-holes H of the anodic oxide film structure AS' may be provided at a narrow pitch depending on the probe 60 requiring a narrow pitch. Accordingly, the partition wall between through-holes H may be thin.

Sliding friction with the probe 60 may occur on the inner surface H' of the through-hole H. Such sliding friction may increase the likelihood of damage to the product by abrading the inner surface H' of the through-hole H.

However, in a modified embodiment of the present disclosure, resistance to abrasion caused by sliding friction may be ensured due to the first thin film layer 11 provided on the inner surface H' of the through-hole H.

Also, in a modified embodiment, since the first thin film layer 11 is capable of supplementing the small thickness of the partition wall between the narrow-pitch through-holes H, abrasion resistance at the small thickness may be improved.

Meanwhile, a modified embodiment may be provided to a semiconductor or display device in a configuration in which a specific fluid is jetted. As such, the modified embodiment may perform a function of jetting a specific fluid through the through-hole H.

The inner surface H' of the through-hole H may cause a problem of chemical reaction or corrosion due to a specific fluid passing through the through-hole H. Accordingly, the inner surface H' of the through-hole H may be damaged, or particles may be generated. In this case, a conventional structure that performs a function of jetting a fluid may cause a problem of jetting particles together during the jetting of the specific fluid.

However, the anodic oxide film structure AS' of the present disclosure is configured such that the first thin film layer 11 is provided on the inner surface H' of the through-hole H, thereby ensuring chemical resistance to a fluid passing through the through-hole H. Specifically, in the modified embodiment that performs a function of jetting a specific fluid, the first thin film layer 11 may be formed of a component having chemical resistance to a specific fluid. Thereby, in the modified embodiment, corrosion or chemical reaction due to the fluid passing through the through-hole H may be prevented. Ultimately, the modified embodiment is capable of exhibiting both corrosion resistance and chemical resistance.

FIG. 2B shows a structure in which an anodic oxide film sheet 10 is configured such that the porous layer PL is located on the barrier layer BL and in which a first thin film layer 11 is formed on the upper surface of the porous layer PL. Here, the anodic oxide film sheet 10 may have through-holes H formed therein.

The modified embodiment shown in FIG. 2B differs from the structure of FIG. 13 in that the through-holes H are formed in the anodic oxide film sheet 10, and the rest of the structure may be the same.

Also, the process of forming the first thin film layer 11 on the inner surface H' of each through-hole H of FIG. 2B may be the same as the process of forming the first thin film layer 11 described in the embodiment of FIG. 13 and the modified embodiment of FIG. 2A. Accordingly, the structure and configuration of the modified embodiment shown FIG. 2B can be understood by referring to FIGS. 13 and 2A, and a description thereof is omitted herein.

FIG. 2C shows a structure in which a first thin film layer 11 is provided on the upper and lower surfaces of an anodic oxide film sheet 10 having therein through-holes H. Here, the first thin film layer 11 may also be provided to a predetermined thickness on the inner surface H' of each through-hole H.

FIG. 2C differs from the embodiment of FIG. 1C in that the through-holes H are provided. Accordingly, corresponding configurations can be understood with reference to FIG. 1C, and a description thereof is omitted herein.

In the modified embodiment of FIG. 2C, the first thin film layer 11 may be formed on the through-holes H in the same manner as the process of forming the first thin film layer 11 described in the embodiment of FIG. 1C and the modified embodiment of FIG. 2A. The configuration thereof can be understood with reference to FIG. 2A, and a description thereof is omitted herein.

FIG. 2D shows an anodic oxide film structure AS' in which an anodic oxide film sheet 10 having therein through-holes H is configured such that the barrier layer BL is located on the porous layer PL.

In the anodic oxide film structure AS', a first thin film layer 11 may be formed on the barrier layer BL on the upper surface thereof, and then a second thin film layer 12 may be formed thereon. Here, the first and second thin film layers 11, 12 may be formed in the same manner as the process of forming the first and second thin film layers 11, 12 in FIG. 1D.

The anodic oxide film structure AS' may include first and second thin film layers 11, 12 on the upper surface thereof, and the first and second thin film layers 11, 12 may be provided on the inner surface H' of each through-hole H.

The first thin film layer 11 may be provided on the inner surface H' of the through-hole H in the same manner as the process of forming the first thin film layer 11 described in the embodiment of FIG. 1D and the modified embodiment of FIG. 2A.

Then, in the anodic oxide film structure AS', a process of forming the second thin film layer 12 may be performed. As described above, the second thin film layer 12 may include a plurality of second monoatomic layers formed to a predetermined thickness through chemical substitution of the second primary precursor and the second secondary reactant.

The second thin film layer 12 may be formed to cover the upper surface of the first thin film layer 11 formed on the inner surface H' of the through-hole H. Here, the second thin film layer 12 may be formed to a thickness that does not fill the through-hole H so that the function of the through-hole H is maintained.

When the modified embodiment as shown in FIG. 2D is provided to a configuration including the probe 60, the abrasion resistance of the inner surface H' of the through-hole H may be further improved. Moreover, in the modified embodiment, the thin partition wall between the through-holes H may be formed to be thicker by the first and second thin film layers 11, 12, so the abrasion resistance and durability of the product itself may be improved.

Meanwhile, the modified embodiment of FIG. 2D may be provided to a semiconductor or display device in a configuration that performs a function of jetting a fluid. Here, the anodic oxide film structure AS' may include the first and second thin film layers 11, 12 on the upper surface of the barrier layer BL and on the inner surface H' of the through-hole H.

The first and second thin film layers 11, 12 may be formed to a predetermined thickness on the upper surface of the barrier layer BL to improve the surface strength of the anodic oxide film structure AS'.

Also, the first and second thin film layers 11, 12 may be formed to a predetermined thickness on the inner surface H' of the through-hole H. The first and second thin film layers 11, 12 may be formed of components having chemical resistance to a fluid passing through the through-hole H, thereby imparting chemical resistance to the anodic oxide film structure AS'.

Also, since the first and second thin film layers 11, 12 have chemical resistance, the inner surface H' of the through-hole H may be prevented from corroding due to a chemical reaction. Therefore, the first and second thin film layers 11, 12 may impart corrosion resistance to the anodic oxide film structure AS'.

The first and second thin film layers 11, 12 may be formed of different components, and thus may exhibit different properties.

Specifically, the first thin film layer 11 may be formed directly on the inner surface H' of the through-hole H. The second thin film layer 12 may be formed on the upper surface of the first thin film layer 11. Accordingly, the fluid passing through the through-hole H may come into direct contact with the second thin film layer 12.

In this case, the first thin film layer 11 may be formed of a component having good rigidity capable of improving the strength of the thickness of the partition wall between the through-holes H on the inner surface H' of the through-hole H. Here, the second thin film layer 12 is preferably formed of a component having chemical resistance to a fluid.

Thereby, the anodic oxide film structure AS' is capable of ensuring high rigidity and chemical resistance by the first and second thin film layers 11, 12. In addition, since the anodic oxide film structure AS' has chemical resistance due to the second thin film layer 12, corrosion by the fluid may not occur. Therefore, the anodic oxide film structure AS' is capable of exhibiting high rigidity, chemical resistance, and corrosion resistance at the same time.

The anodic oxide film structure AS of the present disclosure may be used in the semiconductor or display field. Here, the anodic oxide film structure AS may be provided in a modified structure depending on the function thereof, or may include an additional configuration.

In an exemplary embodiment, the anodic oxide film structure AS may be configured to include an anodic oxide film sheet 10 having a through-hole H therein and a first thin film layer 11 formed on at least one surface of the anodic oxide film sheet 10 and on the inner surface H' of the through-hole H. The configuration of the anodic oxide film structure AS is not limited thereto, and the structures and configurations of various embodiments and modified embodiments described with reference to FIGS. 1A to 1D and 2A to 2D may be used in the semiconductor or display field.

Figure 7:
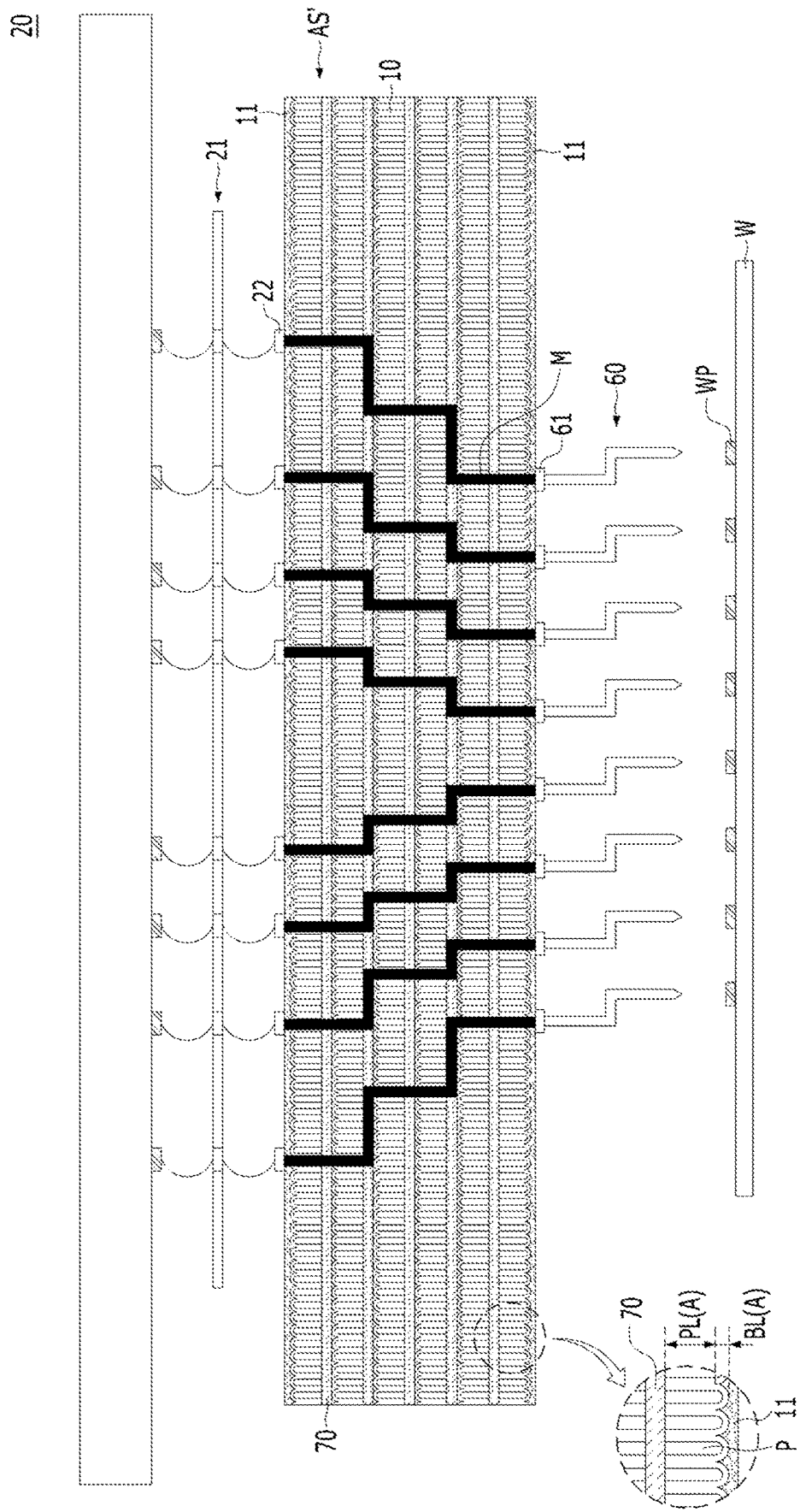
FIGS. 7 and 8 schematically show embodiments in which the anodic oxide film structure of the present disclosure is provided in a specific configuration.

FIG. 7 schematically shows a probe card 20 in which the anodic oxide film structure AS of the present disclosure is provided to a multilayer wiring board. The multilayer wiring board of the probe card 20 may include a probe connection pad 61 that is electrically bonded to a probe 60.

The probe card 20 may perform a function of determining whether there is a defect by applying an electrical signal to chips constituting the semiconductor wafer W.

The probe card may be classified into a vertical probe card 30, a cantilever-type probe card, and a MEMS probe card 20 depending on the structure by which the probe 60 is mounted on the wiring board and the structure of the probe 60.

As shown in FIG. 7, the anodic oxide film structure AS' may be provided to the MEMS probe card 20 in an exemplary embodiment.

The anodic oxide film structure AS' may be configured by laminating a plurality of anodic oxide film sheets 10. Here, the anodic oxide film sheets 10 are vertically laminated and bonded to each other by a bonding layer 70, and a metal material M is provided in through-holes H, thereby implementing the function thereof as a multilayer wiring board.

The anodic oxide film structure AS' may include an anodic oxide film sheet 10 of a layer constituting the surface so that the surface thereof may be composed of a barrier layer BL.

Specifically, as shown in FIG. 7, the anodic oxide film structure AS' may include an anodic oxide film sheet 10, which constitutes the upper surface thereof and is configured such that the barrier layer BL is formed on the porous layer PL. Here, the upper surface of the anodic oxide film structure AS' may be a surface having an interposer connection pad 22 that is electrically connected to an interposer 21.

The anodic oxide film structure AS' may include an anodic oxide film sheet 10, which constitutes the lower surface thereof and is configured such that the barrier layer BL is formed under the porous layer PL. Here, the lower surface of the anodic oxide film structure AS' may be a surface having a probe connection pad 61.

With this structure, the upper and lower surfaces of the anodic oxide film structure AS' may be composed of the barrier layer BL.

The anodic oxide film sheet 10 may include a porous layer PL in which pores P are formed and a barrier layer BL in which pores P are not formed, so the upper and lower surfaces thereof may be asymmetrical. With this structure, there may be a difference in density on the upper and lower surfaces of the anodic oxide film sheet 10.

Accordingly, when a single anodic oxide film sheet 10 constitutes the anodic oxide film structure AS' that performs the function of a multilayer wiring board, warping may occur in a high-temperature environment.

The anodic oxide film structure AS' of the present disclosure may include a plurality of anodic oxide film sheets 10 so that the surfaces thereof are symmetrical with the barrier layer BL.

This structure makes the densities of the upper and lower surfaces of the anodic oxide film structure AS' uniform, so warping does not occur even in a high-temperature environment. Due to this structure, the durability of the anodic oxide film structure AS' may be primarily improved.

In addition, according to the present disclosure, the upper and lower surfaces of the anodic oxide film structure may be composed of the barrier layer BL, and the first thin film layer 11 may be provided on the upper surface of the barrier layer BL. The first thin film layer 11 may exhibit high rigidity and strength, as described above with reference to FIGS. 1A to 1D.

In the present disclosure, the first thin film layer 11 as described above may be formed on the surface of the barrier layer BL constituting the upper and lower surfaces of the anodic oxide film structure. Since the first thin film layer 11 is formed to a predetermined thickness, the strength of the product itself may be further improved while maintaining uniform density of the anodic oxide film structure AS'. With this structure, durability is capable of being additionally improved in the present disclosure. Ultimately, the anodic oxide film structure AS' of the present disclosure is capable of exhibiting high durability.

The anodic oxide film sheets 10 may be bonded to each other by the bonding layer 70, as shown in the enlarged portion of FIG. 7.

The bonding layer 70 may be formed through a photolithography process. Accordingly, the bonding layer 70 may be made of a photosensitive material having photosensitivity. As an example, the bonding layer 70 may be a dry film photoresist (DFR). In addition, since the bonding layer 70 performs a function of bonding the anodic oxide film sheets 10, bonding properties may be exhibited. Accordingly, the bonding layer 70 may be provided in a configuration that simultaneously retains photosensitivity and bonding properties.

Meanwhile, the bonding layer 70 may be made of a thermosetting resin. Examples of the thermosetting resin material may include a polyimide resin, a polyquinoline resin, a polyamideimide resin, an epoxy resin, a polyphenylene ether resin, and a fluororesin.

The MEMS probe card 20 may be provided by performing a process of bonding a separately manufactured probe 60 to the probe connection pad 61. Accordingly, the process of bonding the probe 60 may be performed on the surface of the anodic oxide film structure AS' provided with the probe connection pad 61.

The probe 60 may be manufactured separately on a temporary substrate, bonded to the probe connection pad 61, and then removed from the temporary substrate. As such, the probe 60 may be removed from the temporary substrate using a specific chemical.

The anodic oxide film sheet 10 may be damaged by a specific chemical used in the process of removing the probe 60.

However, the anodic oxide film structure AS' of the present disclosure is capable of ensuring chemical resistance by providing the first thin film layer 11 on the surface of the anodic oxide film sheet 10. Therefore, when the anodic oxide film structure AS' of the present disclosure is provided to the probe card 20 in a configuration that performs the function of a multilayer wiring board, it may not be damaged by a specific chemical.

In addition, the present disclosure is capable of exhibiting corrosion resistance due to the component constituting the first thin film layer 11. Accordingly, in the present disclosure, since the surface of the anodic oxide film structure is protected by the first thin film layer 11, even when exposed to processing using a specific chemical, surface corrosion may be minimized due to corrosion resistance.

In addition, the present disclosure may provide a configuration in which the surface of the anodic oxide film structure is covered by the first thin film layer 11. The MEMS probe card 20 may include the anodic oxide film structure of the present disclosure in the configuration of a multilayer wiring board that is electrically connected to the probe 60. In the conventional multilayer wiring board, when particles are introduced therein, a problem of deterioration of properties of the probe 60 may occur.

However, in the present disclosure, a problem of entry of particles may be prevented by the first thin film layer 11. Accordingly, when the anodic oxide film structure of the present disclosure is provided to the MEMS probe card 20, it is possible to prevent a deterioration in properties due to the introduction of particles.

Figure 8:
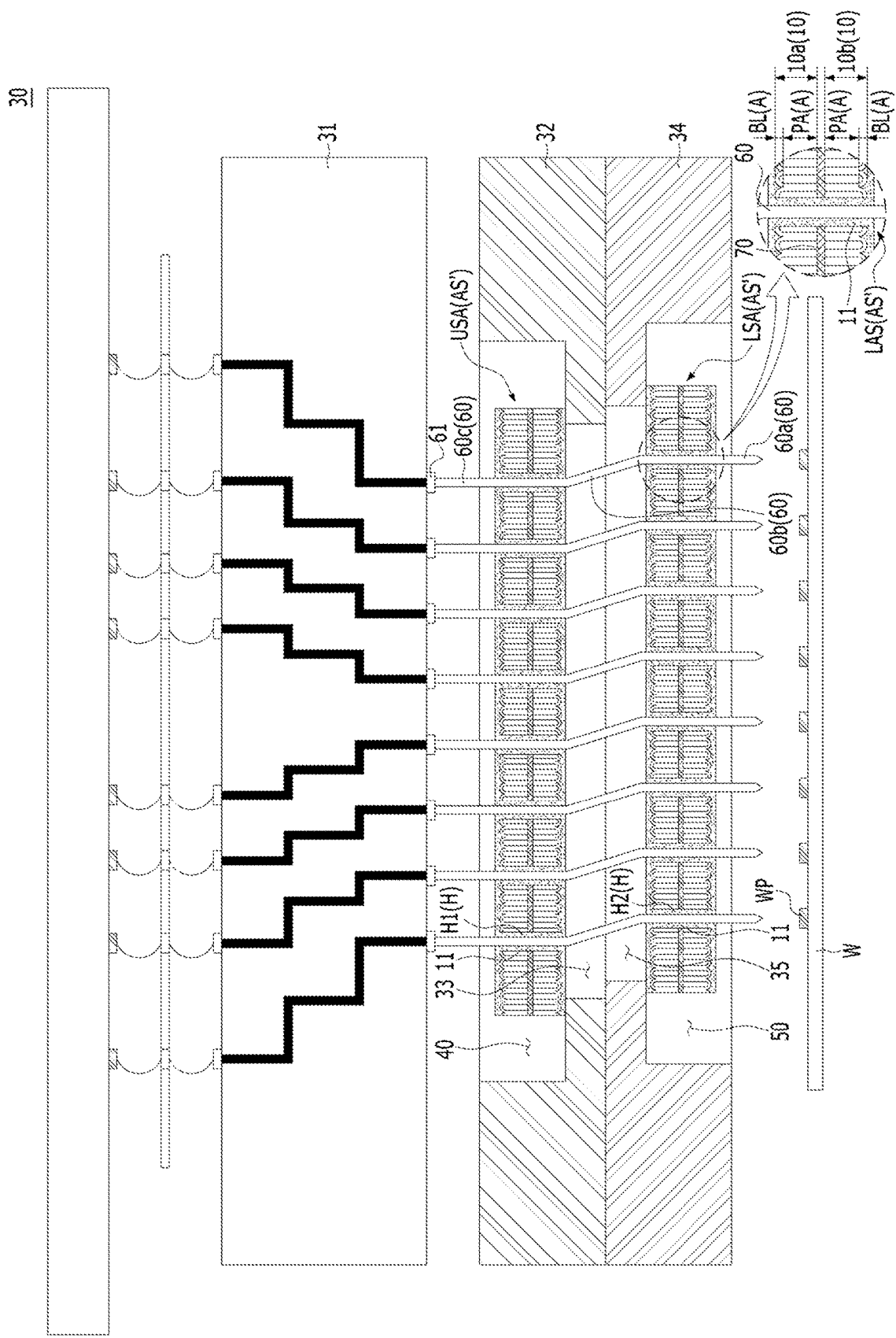

FIG. 8 schematically shows a vertical probe card 30 including the anodic oxide film structure AS' of the present disclosure.

The vertical probe card 30 may include a guide plate that supports a probe 60 in order to accurately position the probe 60. The anodic oxide film structure AS of the present disclosure may be provided to the vertical probe card 30 to function as a guide plate.

As shown in FIG. 8, the anodic oxide film structure AS' may be provided under a wiring board 31 and the probe 60 may be provided and supported in each through-hole H.

The anodic oxide film structure AS' may be configured to include an upper anodic oxide film structure AS and a lower anodic oxide film structure AS, and may be provided to the vertical probe card 30.

Here, the anodic oxide film structure AS' may be supported by a plate configuration including first and second plates 32, 34.

The first and second plates P1, P2 are provided so as to correspond to each other, but may be coupled in an inverted form. Specifically, the second plate P2 may be coupled with the first plate P1 in an inverted form under the first plate P1. This plate configuration P may include the anodic oxide film structure AS'.

As shown in FIG. 8, the first plate 32 may include an upper seating region 40, capable of accommodating the upper anodic oxide film structure AS. The second plate 34 may include a lower seating region 50, capable of accommodating the lower anodic oxide film structure AS.

The first and second plates 32, 34 may be coupled to each other in an inverted form. Accordingly, the upper seating region 40 and the lower seating region 50 may be provided at inverted positions in the same shape.

The first plate 32 may have a first through-hole 33 in the lower portion of the upper seating region 40, and the second plate 34 may have a second through-hole 35 in the upper portion of the lower seating region 50.

The first and second through-holes 33, 35 may be provided to position a plurality of probes 60 inserted through upper and lower through-holes H1, H2 to be described later. Accordingly, the first and second through-holes 33, 35 may be formed to an inner diameter capable of accommodating the probes in consideration of elastic deformation of the plurality of probes 60.

Each of the seating regions 40 and 50 of the plates may be provided with the anodic oxide film structure AS.

The upper anodic oxide film structure AS may have therein upper through-holes H1 and the lower anodic oxide film structure AS may have therein lower through-holes H2. Accordingly, the through-holes H in the anodic oxide film structure AS' may include the upper and lower through-holes H1, H2.

The anodic oxide film structure AS' may be configured such that a plurality of anodic oxide film sheets 10 is vertically bonded by the bonding layer 70. Here, the plurality of anodic oxide film sheets 10 may be laminated and bonded so that the through-holes H therein are positioned to correspond to each other. The present disclosure is capable of improving rigidity through a structure in which the anodic oxide film sheets 10 are laminated.

The anodic oxide film structure AS' may include the plurality of anodic oxide film sheets 10 such that the surface thereof is composed of a barrier layer BL.

In an exemplary embodiment, as shown in the enlarged portion of FIG. 8, the lower anodic oxide film structure AS may include a first anodic oxide film sheet 10a and a second anodic oxide film sheet 10b. In FIG. 8, two anodic oxide film sheets 10 are illustrated, but the number thereof may be further increased.

Here, the first anodic oxide film sheet 10a may be configured such that the barrier layer BL is provided on the porous layer PL to constitute the upper surface of the lower anodic oxide film structure AS.

The second anodic oxide film sheet 10b may be provided under the first anodic oxide film sheet 10a. Here, the first and second anodic oxide film sheets 10a, 10b may be bonded by the bonding layer 70.

The second anodic oxide film sheet 10b may be configured such that the barrier layer BL is provided under the porous layer PL to constitute the lower surface of the lower anodic oxide film structure AS.

Accordingly, the lower anodic oxide film structure AS may be configured such that the upper and lower surfaces are symmetrical with the barrier layer BL. Due to this structure, the densities of the upper and lower surfaces of the lower anodic oxide film structure AS may become uniform.

Ultimately, the anodic oxide film structure AS' is capable of improving the effect of preventing warping.

The upper and lower anodic oxide film structures UAS, LAS may have the same configuration and structure. Therefore, the upper anodic oxide film structure AS may have the same configuration and structure as the lower anodic oxide film structure AS described above, so the effect of preventing warping may be exhibited.

In addition, the anodic oxide film structure AS' may be configured such that the densities of the upper and lower surfaces thereof are uniform due to the barrier layer BL, so damage due to abrasion during insertion of the probe 60 may be minimized.

Specifically, when the anodic oxide film structure AS is provided as a guide plate, the probe 60 may be inserted. Here, the anodic oxide film structure AS' of the present disclosure may be configured such that the inner wall of the opening of each through-hole H is composed of the barrier layer BL, having high density.

Thereby, in the present disclosure, durability against abrasion occurring on the inner wall of the upper opening of the through-hole H, into which the tip of the probe 60 is inserted first, may be relatively high. Ultimately, the present disclosure is capable of preventing a problem of formation of particles caused by abrasion of the opening of the through-hole H when the probe 60 is inserted.

In addition, as shown in the enlarged portion of FIG. 8, a first thin film layer 11 may be provided on the surface of the anodic oxide film structure AS of the present disclosure. The upper and lower anodic oxide film sheets 10 may be bonded, and then the first thin film layer 11 may be formed on the surface thereof.

In an exemplary embodiment, the anodic oxide film structure AS' may include the first thin film layer 11 formed on the entireties of the upper and lower surfaces thereof, and the first thin film layer 11 may be formed on the inner surface H' of the through-hole H. Here, the present disclosure is capable of ensuring further improved abrasion resistance owing to the first thin film layer 11.

Specifically, one end of the probe 60 may be first inserted through the upper through-hole H1 and then into the lower through-hole H2. Thereby, the probe 60 may be provided in a configuration in which the remaining end 60c is located in the upper through-hole H1, the middle portion 60b is located in the first and second through-holes 33, 35, and the one end 60a, inserted first, protrudes by being inserted into the lower through-hole H2 in the lower anodic oxide film structure AS.

In the present disclosure, since the first thin film layer 11 is provided on the inner surface H' of the through-hole H, the entire inner surface H' including the inner wall of the opening of the through-hole H may be imparted with abrasion resistance to withstand the process of inserting the probe 60 as described above.

With this structure, the present disclosure is capable of preventing a problem in which the inner surface H' of the through-hole H is damaged by the probe 60 in the process of inserting the probe 60 into the through-hole H.

In addition, according to the present disclosure, abrasion resistance against sliding friction between the through-hole H and the probe 60 may be improved by the first thin film layer 11. In the anodic oxide film sheet 10, since the through-holes H are provided at a narrow pitch, the partition wall between the through-holes H may be formed to be thin. Accordingly, in the anodic oxide film sheet 10, a problem in which the inner surface H' of each through-hole H abrades due to sliding friction between the through-hole H and the probe 60 may easily occur.

However, in the present disclosure, since the first thin film layer 11 is provided on the inner surface H' of the through-hole H, the thin partition wall between the through-holes H may be supplemented. Accordingly, in the present disclosure, abrasion resistance against sliding friction between the through-hole H and the probe 60 may be improved. Ultimately, even when the invention disclosed herein is used for a long period of time, the risk of damage due to abrasion may be minimized, and durability may be increased.

In addition, the present disclosure may provide a structure in which the surface is covered by the first thin film layer 11. Accordingly, in the present disclosure, a problem of entry of particles may be prevented.

As described above, the present disclosure is capable of exhibiting an effect of improving durability when provided in a configuration as the guide plate of the vertical probe card 30. In addition, resistance to abrasion caused by sliding friction may be ensured. Accordingly, the present disclosure can function as a guide plate in a configuration having both durability and abrasion resistance.

Since the anodic oxide film structure AS of the present disclosure is made of a material for an anodic oxide film A, thermal deformation may be low in a high-temperature environment. Thereby, the present disclosure may be effectively used in a semiconductor or display field that requires processing in a high-temperature atmosphere.

In an exemplary embodiment, in the probe card 20, 30 including the anodic oxide film structure of the present disclosure, a burn-in test may be performed in order to ensure the reliability of a chip. The burn-in test may be conducted in a high-temperature environment of 85° C. to 100° C. Thereby, the anodic oxide film structure AS may be exposed to high temperatures.

However, in the present disclosure, due to the low coefficient of thermal expansion, thermal deformation upon exposure to high temperatures may be low. Thus, even when the through-hole H is provided in the present disclosure, a problem in which a difference between the position of the through-hole H and the inspection position of the object to be inspected occurs may be prevented. Accordingly, the present disclosure is capable of preventing the problem of deterioration of positional accuracy of the additional configuration provided in the through-hole H.

In addition, the present disclosure is capable of exhibiting properties of durability, chemical resistance, and abrasion resistance by including the first thin film layer 11. Moreover, the present disclosure is capable of solving the problem of re-exposure of the crack C due to corrosion of the conventional thin film layer 11' and the problem of outgassing due to the pore P. Thereby, when the present disclosure is provided in a configuration that performs a specific function in a specific field, the efficiency of the overall performance of the product can be increased.

As described hereinbefore, the present disclosure has been described with reference to the preferred embodiments, but it will be apparent to those skilled in the art that various modifications or substitutions are possible, without departing from the scope and spirit of the invention as disclosed in the accompanying claims.

What is claimed is:

1. An anodic oxide film structure, comprising:
    an anodic oxide film sheet comprising a non-porous barrier layer in which pores are not formed, and a porous layer disposed on a first surface of the non-porous barrier layer and having pores formed therein; and
    a first thin film layer provided on a second surface of the non-porous barrier layer, the first surface being opposite to the second surface,
    wherein the first thin film layer comprises a plurality of first monoatomic layers formed by repeatedly performing a cycle of adsorbing a first primary precursor and supplying a first secondary reactant different from the first primary precursor to form a first monoatomic layer through chemical substitution of the first primary precursor and the first secondary reactant.

2. The anodic oxide film structure of claim 1, wherein a thickness of the first thin film layer falls in a range from 20 nm to 3 µm.

3. The anodic oxide film structure of claim 1, wherein a thickness of the non-porous barrier layer falls in a range from 100 nm to 1 µm.

4. An anodic oxide film structure, comprising:
    an anodic oxide film sheet comprising a non-porous barrier layer in which pores are not formed, a porous layer disposed on the non-porous barrier layer and having pores formed therein, and a through-hole provided in the anodic oxide film sheet, the through-hole being separate from the porous layer; and
    a first thin film layer provided on at least one of a surface of the porous layer and a surface of the non-porous barrier layer and on an inner surface of the through-hole,
    wherein the first thin film layer comprises a plurality of first monoatomic layers formed by repeatedly performing a cycle of adsorbing a first primary precursor and supplying a first secondary reactant different from the first primary precursor to form a first monoatomic layer through chemical substitution of the first primary precursor and the first secondary reactant.

5. The anodic oxide film structure of claim 1, wherein a second thin film layer is formed on the first thin film layer, the second thin film layer comprising a plurality of second monoatomic layers formed by repeatedly performing a cycle of adsorbing a second primary precursor on the first thin film layer and supplying a second secondary reactant different from the second primary precursor to form a second monoatomic layer through chemical substitution of the second primary precursor and the second secondary reactant, and the first thin film layer and the second thin film layer have different components.

6. The anodic oxide film structure of claim 4, wherein anodic oxide film sheets are vertically laminated and bonded to each other by a bonding layer, and a metal material is provided in the through-hole.

* * * * *